United States Patent
Uehling

(10) Patent No.: US 9,385,064 B2
(45) Date of Patent: Jul. 5, 2016

(54) HEAT SINK HAVING A THROUGH-OPENING

(71) Applicant: Trent S. Uehling, New Braunfels, TX (US)

(72) Inventor: Trent S. Uehling, New Braunfels, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 5 days.

(21) Appl. No.: 14/262,894

(22) Filed: Apr. 28, 2014

(65) Prior Publication Data

US 2015/0311136 A1  Oct. 29, 2015

(51) Int. Cl.
*H01L 23/00* (2006.01)
*H01L 23/367* (2006.01)
*H01L 23/467* (2006.01)

(52) U.S. Cl.
CPC .......... *H01L 23/3675* (2013.01); *H01L 23/467* (2013.01); *H01L 24/29* (2013.01); *H01L 24/16* (2013.01); *H01L 24/32* (2013.01); *H01L 24/73* (2013.01); *H01L 2224/16225* (2013.01); *H01L 2224/2929* (2013.01); *H01L 2224/29291* (2013.01); *H01L 2224/29393* (2013.01); *H01L 2224/32245* (2013.01); *H01L 2224/73253* (2013.01); *H01L 2924/10252* (2013.01); *H01L 2924/10253* (2013.01); *H01L 2924/10271* (2013.01); *H01L 2924/10329* (2013.01); *H01L 2924/15311* (2013.01); *H01L 2924/15312* (2013.01)

(58) Field of Classification Search
CPC .............. H01L 23/467; H01L 23/3675; H01L 2924/15312; H01L 24/16; H01L 24/29; H01L 24/32; H01L 24/73; H01L 2224/16225; H01L 2224/2929; H01L 2224/29291; H01L 2224/29393; H01L 2224/32245; H01L 2224/73253; H01L 2924/10252; H01L 2924/10253; H01L 2924/10271; H01L 2924/10329; H01L 2924/15311
See application file for complete search history.

(56) References Cited

U.S. PATENT DOCUMENTS

| | | | | |
|---|---|---|---|---|
| 5,896,917 A * | 4/1999 | Lemont et al. | | 165/80.3 |
| 6,698,511 B2 | 3/2004 | DiBene et al. | | |
| 6,853,553 B2 | 2/2005 | Seaton et al. | | |
| 7,457,113 B2 | 11/2008 | Kumhyr et al. | | |
| 7,589,967 B2 * | 9/2009 | Zhou | | H01L 23/4006 165/185 |
| 2004/0261976 A1 * | 12/2004 | Watanabe | | H01L 23/467 165/87 |
| 2005/0087326 A1 * | 4/2005 | Barmoav et al. | | 165/80.3 |
| 2009/0310301 A1 | 12/2009 | Nelson et al. | | |
| 2013/0082407 A1 * | 4/2013 | Abbott et al. | | 257/787 |

FOREIGN PATENT DOCUMENTS

EP  1526570 A2  9/2004

* cited by examiner

*Primary Examiner* — Caleb Henry
*Assistant Examiner* — Alexander Belousov

(57) ABSTRACT

A semiconductor structure includes a heat sink. The heat sink having a first major surface, a second major surface, a first sidewall surface, and a through-opening extending from one of the first sidewall surface or the first major surface of the heat sink to the second surface of the heat sink, and wherein the through-opening has an inflow region, a restrictive region, and an outflow region. The restrictive region is located between the inflow region and the outflow region, wherein the inflow region has an inflow surface opening at the one of the first sidewall or the first major surface, and the outflow region has an outflow surface opening at the second major surface. A cross-sectional area of the restrictive region is less than an area of the inflow surface opening and less than an area of the outflow surface opening.

20 Claims, 3 Drawing Sheets

HEAT SINK HAVING A THROUGH-OPENING

BACKGROUND

1. Field

This disclosure relates generally to heat sinks, and more specifically, to improving heat dissipation using a heat sink having a restrictive region.

2. Related Art

Semiconductor devices, such as network devices, typically have a high operating temperature, where dissipation of the heat generated by a semiconductor device is an important reliability concern. As a consumer product, semiconductor devices must typically meet operating temperature requirements, since instantaneous high temperature rises can possibly cause catastrophic failure of the semiconductor device. Failure to adequately dissipate heat generated by a semiconductor device could lead to long-term degradation in the semiconductor device and any package materials, both of which may eventually lead to device failure.

BRIEF DESCRIPTION OF THE DRAWINGS

The present invention may be better understood, and its numerous objects, features, and advantages made apparent to those skilled in the art by referencing the accompanying drawings.

Figure 1:
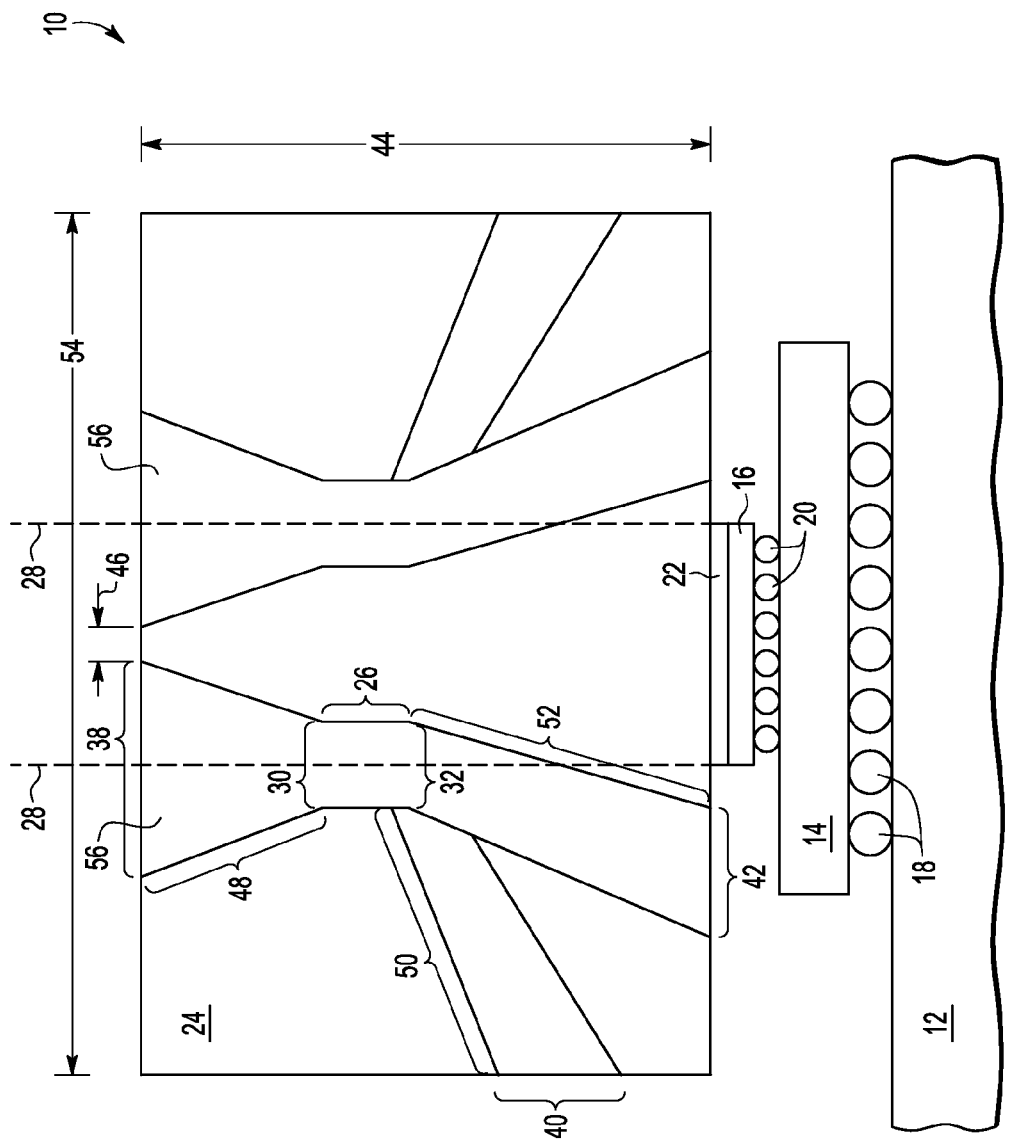
FIG. 1 illustrates an example semiconductor structure in which the present disclosure is implemented, according to some embodiments.

The present invention is illustrated by way of example and is not limited by the accompanying figures, in which use of the same reference symbols indicates same elements unless otherwise noted. Elements in the figures are illustrated for simplicity and clarity and have not necessarily been drawn to scale.

DETAILED DESCRIPTION

Network devices, such as home and office modems, set-top boxes, and routers, generate heat during operation, which is dissipated using a thermal solution. Some examples of such thermal solutions involve some type of static heat sink that relies on natural convection for heat transfer to the surrounding environment, without forced air flow. Addition of a fan to the thermal solution to cause forced air flow (or forced convection) would increase heat transfer, but would also unacceptably increase the thermal solution module size and price. A conventional heat sink without forced air flow (e.g., a heat sink with fins) is often barely capable of dissipating enough heat generated by the network device to remain within maximum allowable temperature limits.

The present disclosure provides for a method and semiconductor structure related to a heat sink having a restrictive region. The present disclosure utilizes a number of through-openings that extend through the heat sink. A through-opening includes one or more inflow regions, a restrictive region, and an outflow region. The one or more inflow regions extend from a bottom surface or from a sidewall surface of the heat sink to a restrictive region. The restrictive region is located between the one or more inflow regions and the outflow region. The outflow region extends from the restrictive region to a top surface of the heat sink. The outflow region has an outflow surface opening at the top surface of the heat sink. Each of the one or more inflow regions have an inflow surface opening at the bottom surface or sidewall surface of the heat sink. The outflow region is generally located above the restrictive region and the one or more inflow regions are generally located below the restrictive region. Each inflow region extends through the heat sink and joins the restrictive region at an angle of 0 to 90 degrees.

As heat from a semiconductor die is transferred to the heat sink, natural convection heats the air in the inflow region of the through-opening. The heated air travels up the through-opening and encounters the restrictive region of the through-opening. Due to conservation of energy, the heated air flow increases in velocity as it passes through the restrictive region, which also causes a drop in pressure in the restrictive region. The pressure drop in turn draws additional air through the one or more inflow regions, thereby increasing the volume of air flow passing through the through-opening. Accordingly, a through-opening enhances the vertical air movement created by natural convection in order to maximize air flow and aid in effective heat transfer. A through-opening also includes one or more inflow regions in order to maximize surface area, which in turn aids in effective heat transfer.

FIG. 1 illustrates an example semiconductor structure in which the present disclosure is implemented. Semiconductor structure 10 includes a printed circuit board (PCB) 12, a package substrate 14, a semiconductor die 16, interconnections 18, interconnections 20, a thermal interface material 22, and a heat sink 24. One of ordinary skill in the art will appreciate that the example semiconductor structure is provided for illustrative purposes only to further explain applications of the present disclosure, and is not meant to limit the present disclosure in any manner. Other components of semiconductor structure 10 may be present and used as appropriate for a given application.

Semiconductor die 16 is a small electronic device formed on a semiconductor wafer, such as a silicon wafer, which has formed therein electronic circuitry for performing specified operations and functions. The semiconductor die described herein can be any semiconductor material or combinations of materials, such as gallium arsenide, silicon germanium, silicon-on-insulator (SOI), silicon, monocrystalline silicon, the like, and combinations of the above. Semiconductor die 16 is mounted onto package substrate 14, which provides mechanical base support and external electrical connections for semiconductor die 16. Examples of package substrate 14 include a ball grid array, a pin grid array, an in-line package, a flat package, a chip carrier, and the like. Interconnections 20 electrically couple package substrate 14 and semiconductor die 16. Package substrate 14 is mounted onto printed circuit board 12, which provides mechanical base support and electrical connections for package substrate 14. PCB 12 includes electrically conductive features on a non-conductive substrate. Interconnections 18 electrically couple PCB 12 and package substrate 14. A perimeter 28 of semiconductor die 16 is illustrated as dotted lines extending through heat sink 24 from the left and right edges of semiconductor die 16.

Thermal interface material 22 is positioned between semiconductor die 16 and heat sink 24. Thermal interface material 22 is heat conductive to improve heat transfer from semiconductor die 16 to heat sink 24. Thermal interface material 22 can be a silicone or epoxy-resin based material containing suspended carbon nanotubes, or beryllium oxide, aluminum nitride, boron nitride, or diamond powders. In some embodiments, thermal interface material 22 can be a phase-change metal alloy, a grapheme-based adhesive, or the like. A portion of the surface of heat sink 24 that is in contact with thermal interface material 22 receives heat transferred from semiconductor die 16 and acts as a heat spreader. Heat sink 24 can be made of an electrically conductive material or an electrically insulating material. Heat sink 24 can be formed of aluminum, aluminum alloys, copper, copper alloys, boron nitride, aluminum nitride, diamond, carbon nanotubes, and combinations thereof.

Heat sink 24 has two major surfaces opposite one another, also referred to as a top surface and a bottom surface, which are substantially parallel to one another. Heat sink 24 has a major surface width dimension 54, measured from edge to edge of the major surface of the heat sink. Heat sink 24 also has a sidewall surface between the two major surfaces that is substantially perpendicular to the two major surfaces. Heat sink 24 has a sidewall height dimension 44, measured from edge to edge of the sidewall surface.

Heat sink 24 includes one or more through-openings 56, or one or more voids formed in heat sink 24, that extend from one surface of the heat sink to another surface of the heat sink. Each through-opening 56 includes one or more inflow regions (such as inflow region 50 or inflow region 52), a restrictive region 26, and an outflow region 48, as discussed below. Each through-opening 56 can be created using known techniques, such as machining, milling, sintering, or powder molding the heat sink to produce the through-openings.

There are two types of inflow regions, a side inflow region 50 and a bottom inflow region 52. Side inflow region 50 has an opening 40 (also referred to as a sidewall inflow opening) in a sidewall surface of heat sink 24. Bottom inflow region 52 has an opening 42 (also referred to as a bottom inflow opening) in a bottom surface (also referred to as a first major surface) of heat sink 24. In one embodiment, a through-opening includes at least one side inflow region and at least one bottom inflow region. In one embodiment, a through-opening includes one or more side inflow regions. In one embodiment, a through-opening includes one or more bottom inflow regions.

Outflow region 48 has an opening 38 (also referred to as an outflow opening) in a top surface (also referred to as a second major surface) of heat sink 24. In the example illustrated, heat sink 24 has at least two through-openings 56, with each through-opening 56 having an outflow opening in the top surface of heat sink 24. The two outflow openings are separated by a distance dimension 46, measured as the least distance separating the edges of the outflow openings. Outflow opening 38, sidewall inflow opening 40, and bottom inflow opening 42 each have a width dimension measured as the greatest distance separating two opposing points on the opening.

Restrictive region 26 is located between the one or more inflow regions and the outflow region. Restrictive region 26 is a hollow structure that has an opening 30 (also referred to as a top restrictive opening) at a top end of restrictive region 26 and an opening 32 (also referred to as a bottom restrictive opening). In one embodiment, restrictive region 26 has a consistent width dimension and cross-sectional area throughout the length of the restrictive region, where top opening 30 is the same size and shape as bottom opening 32. Through-opening 56 is discussed in further detail in connection with FIG. 2.

Figure 2:
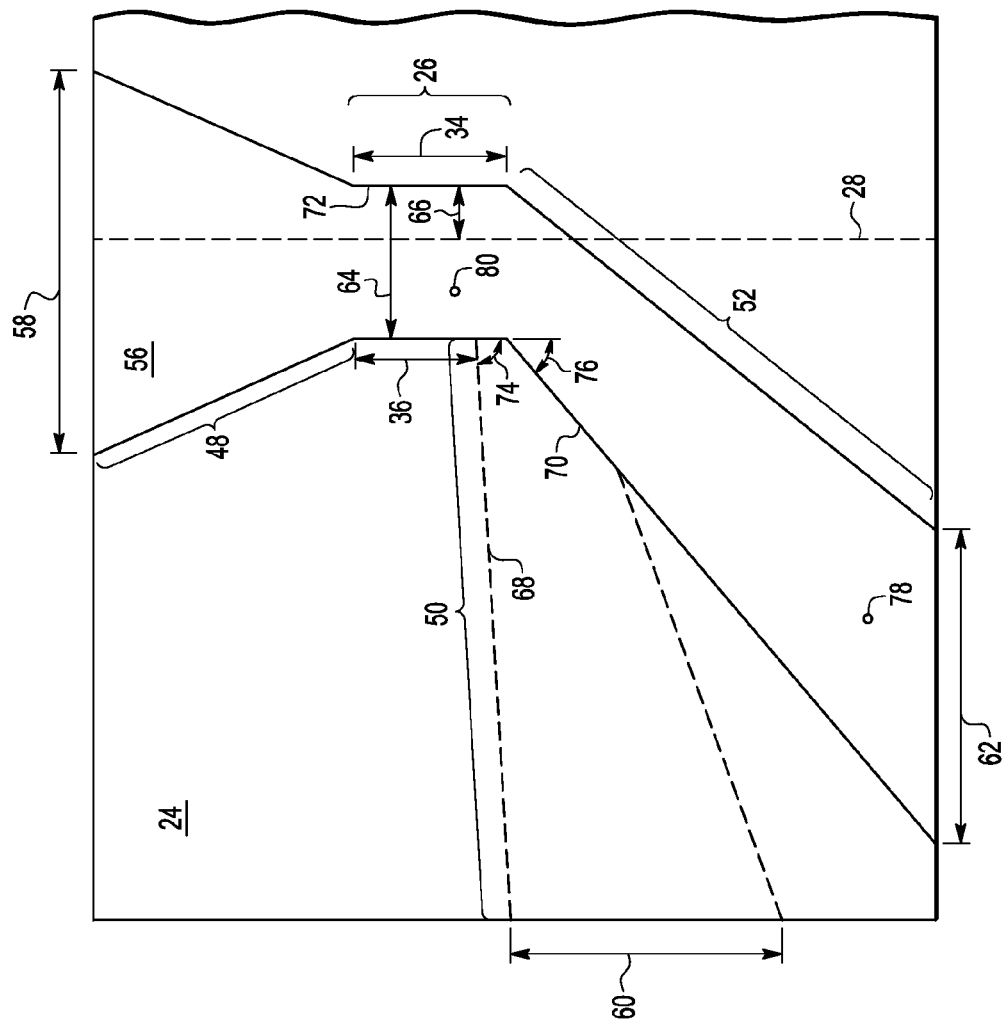
FIG. 2 illustrates a partial side cross-sectional view of an example heat sink in which the present disclosure is implemented, according to some embodiments.

FIG. 2 illustrates a partial side cross-sectional view of an example heat sink. A cross-sectional view of through-opening 56 is illustrated, having outflow region 48, restrictive region 26, and inflow region 52 outlined in a solid line. Through-opening 56 also includes inflow region 50 outlined in a dotted line, indicating that inflow region 50 is located within the heat sink beyond the illustrated cross-section view. Outflow opening 38 of outflow region 48 has a width dimension of 58. Side inflow opening 40 of inflow region 50 has a width dimension of 60. Bottom inflow opening 42 of inflow region 52 has a width dimension of 62. In the embodiment illustrated, top restrictive opening 30 and bottom restrictive opening 32 of restrictive region 26 each have a same width dimension 64. Width dimensions 58, 60, 62, and 64 are each measured as the greatest distance separating two opposing points on the respective opening. In one embodiment, width dimension 64 can also be measured as the greatest distance separating two opposing points on the walls of restrictive region 26.

Restrictive region 26 has a length dimension 34 measured from edge to edge of the restrictive region, or from top restrictive opening 30 to bottom restrictive opening 32. Restrictive region 26 is positioned over the edge of semiconductor die 16, as indicated by die perimeter 28 intersecting a portion of restrictive region 26, in order to increase the amount of heat transferred from semiconductor die 16 to the internal surface area of the through-opening. The die perimeter and an interior wall 72 of restrictive region 26 (e.g., a wall closest to the interior of the heat sink) are separated by a distance dimension 66, measured as the distance between die perimeter 28 and interior wall 72. Distance dimension 66 is maximized in order to improve the heat transfer efficiency of semiconductor die 16, as further discussed below. In one embodiment, restrictive region 26 is positioned over semiconductor die 16 so that the entirety of restrictive region 26 is within die perimeter 28. In some embodiments, restrictive region 26 is positioned over semiconductor die 16 so that twenty-five percent (25%), thirty percent (30%), fifty percent (50%), seventy-five percent (75%), or some other percentage of the cross-sectional area of restrictive region 26 is within die perimeter 28.

In one embodiment, the inflow openings 40 and 42 are located outside of die perimeter 28, in order to pull in air from the surrounding environment. The location of inflow openings being outside of die perimeter 28 is especially helpful in an embodiment where thermal interface material completely covers or adheres to a corresponding surface of the heat sink within die perimeter 28 (thereby avoiding the openings being masked or closed by the thermal interface material).

Outflow region 48 joins restrictive region 26 at the top of restrictive region 26 (e.g., at the top restrictive opening of restrictive region) and each inflow region 50 and 52 join restrictive region 26 at the bottom of restrictive region 26 (e.g., at the bottom restrictive opening of restrictive region). Side inflow region 50 has a top wall 68 and bottom inflow region 52 has a top wall 70 (e.g., a wall closest to the top surface of the heat sink). The top wall 68 of each side inflow region 50 and top wall 70 of each bottom inflow region 52 join restrictive region 26 at a point located below the top of restrictive region, in order to ensure that air flow will travel in the same direction through the through-opening (e.g., air is drawn in from inflow regions, passes through restrictive region, and leaves through outflow region). The length dimension 36 measured from the top of restrictive region 26 to the top wall of an inflow region can be different for each given inflow region, depending on the angle at which the given inflow region's top wall joins the restrictive region. Such a join angle ranges from 0 to 90 degrees, inclusive, with some example angles including 25 degrees, 30 degrees, 45 degrees, 60 degrees, and the like. In the embodiment shown, inflow region 50 joins at an angle 74, which is approximately 85 degrees, while inflow region 52 joins at an angle 76, which is approximately 45 degrees.

Restrictive region 26 has a cross-sectional area (which is the same as the cross-sectional area of restrictive opening 30 and the same as the cross-sectional area of restrictive opening 32) that is less than a cross-sectional area of outflow opening 38, less than a cross-sectional area of sidewall inflow opening 40, and less than a cross-sectional area of bottom inflow opening 42. The cross-sectional areas of restrictive region 26, outflow opening 38, sidewall inflow opening 40, and bottom inflow opening 42 form shapes that, in some embodiments, include polygonal shapes (e.g., rectangular, triangular, quadrilateral, and the like), curved shapes (e.g., circular, elliptical, curved irregular, and the like), or a combination thereof. In an illustrative example, outflow opening width 58 is 10 units, sidewall opening width 60 is 7 units, bottom opening width 62 is 8 units, and restrictive opening width 30 is 4 units, indicating that the cross-sectional area of restrictive region 26 is less than the cross-sectional areas of the outflow opening, sidewall opening, and bottom opening.

At an initial state, air from the surrounding environment is present in through-opening 56. As heat from semiconductor die 16 is transferred to heat sink 24, heat sink 24 acts as a heat spreader and transfers heat throughout the heat sink, heating the internal surface area of through-opening 56. Natural convection heats the air that is in contact with the surface (e.g., interior walls) of through-opening 56. The heated air begins to travel up through-opening 56 (e.g., up through inflow region 52), flowing at a volumetric flow rate, which is the amount (or volume) of air (acting as a non-viscous, incompressible fluid in steady flow) that passes through a given area per unit time. Due to conservation of energy, the volumetric flow rate at one point in through-opening 56, such as point A or point 78, is equal to the volumetric flow rate at another point in through-opening 56, such as point B or point 80. In other words, the amount of air flowing through a cross-sectional area at point 78 is equal to the amount of air flowing through a cross-sectional area at point 80. The relationship between the volumetric flow rate at two points can be generally described as the cross-sectional area A multiplied by air flow velocity v at point A is equal to the cross-sectional area A multiplied by air flow velocity v at point B (or $A_A \cdot v_A = A_B \cdot v_B$).

The heated air flow encounters restrictive region 26, which has a smaller cross-sectional area than the cross-sectional area of inflow region 52 (or smaller than the cross-sectional area of inflow opening 42). In order to maintain the same volumetric flow rate at the restrictive region (which has a smaller cross-sectional area), the air flow's velocity increases as the air flow travels through restrictive region. The conservation of energy also indicates that as velocity increases in the restrictive region, the pressure within the restrictive region decreases, which is also referred to as the Venturi effect. In a very simple form (ignoring friction and heat), the pressure and velocity of the air flow at one point in through-opening 56, such as point A or point 78, is equal to the pressure and velocity of the air flow at another point in through-opening 56, such as point B or point 80. In other words, the relationship between pressure and velocity at two points can be generally described as the pressure P multiplied by air flow velocity v at point A is equal to the pressure P multiplied by air flow velocity v at point B (or $P_A \cdot v_A = P_B \cdot v_B$).

Since the pressure is comparatively higher near the openings 40 and 42 of inflow regions 50 and 52, the decrease in pressure at restrictive region 26 draws in additional air from inflow regions 50 and 52. This air flow also travels up through-opening 56 and encounters restrictive region 26, where the air flow similarly has an increase in velocity and decrease in pressure. Additional air flow is drawn in and up through-opening 56, eventually achieving a steady state of air flow. Air flow (or heated air) passes through outflow region and is released into the surrounding environment. Accordingly, once heat sink 24 begins to receive transferred heat from semiconductor die, through-opening 56 implements a self-propagating means of drawing air flow up through-opening 56.

The pressure differential between point A (or point 78) in an inflow region and point B (or point 80) in the restrictive region can be calculated using the following equation:

$$\Delta p = \frac{1}{2} \rho V_a^2 \left[ \left( \frac{A_a}{A_b} \right)^2 - 1 \right] \qquad \text{Equation 1}$$

where $\Delta p$ is the pressure differential, $V_a$ is the air flow velocity at point A in the inflow region, $A_a$ is the cross-sectional area of the inflow region (or inflow opening) at point A, $A_b$ is the cross-sectional area of the restrictive region at point B, and p is the density of air, such as 1.109 Kg/m³ at 50 degrees Celsius.

It is noted that the number of inflow regions, as well as the interior surface area of each inflow region and outflow region of a through-opening, are maximized in order to maximize the cumulative internal surface area of each through-opening, which is interior to the heat sink. In some embodiments, each inflow region and outflow region can be conical in shape in order to maximize the surface area of each inflow region and outflow region. A greater number of inflow regions can also provide a greater cumulative surface area for the through-opening. A maximized cumulative surface area of the through-opening ensures greater contact with air from the surrounding environment, which improves the natural convection that heats the air within the through-opening. In other words, a greater cumulative surface area of the through-opening improves the through-opening's heat transfer efficiency, which in turn maximizes the overall heat dissipation of the heat sink.

It is noted that the positioning of restrictive region 26 over the edge of die perimeter 28 also affects the heat transfer efficiency of the through-opening. As the heat sink begins to receive heat transferred from semiconductor die 16, the heat sink acts as a heat spreader and transfers heat throughout the heat sink, which also heats the internal surface area of through-opening 56. If restrictive region 26 is placed near or over semiconductor die 16, the internal surface area of through-opening 56 receives a maximized amount of the transferred heat, as opposed to restrictive region 26 being placed far away from semiconductor die 16 where the transferred heat may dissipate due to natural convection at the top surface or sidewall surface of the heat sink. This surface dissipation may reduce the amount of heat transferred to the air inside the through-opening, which in turn may reduce the natural convection that heats the air within the through-opening. In other words, positioning at least a portion of the restrictive region within die perimeter 28 improves the heat transfer efficiency of the through-opening, as well as overall heat dissipation of the heat sink.

Close placement of restrictive region to semiconductor die 16 also ensures that the internal surface area of through-opening heats up quickly and begins to enhance the natural convection quickly. This avoids an unnecessary time delay in dissipating heat from the heat sink, during which the surface temperature of a portion of the heat sink may exceed a maximum surface temperature. Accordingly, at least a portion of the restrictive region is placed over die perimeter 28 in order to maximize the heat transferred from semiconductor die 16 to the internal surface area of the through-opening, ensuring that the internal surface area is heated quickly and begins to draw air flow up through-opening 56.

It is noted that as length dimension 34 grows longer, the air flow velocity begins to slow due to friction of the air within restrictive region 26. A slower air flow velocity within restrictive region reduces the pressure differential between the restrictive region and inflow regions, which in turn reduces the amount of air drawn in through the through-opening. Accordingly, length dimension 34 is minimized in a manner that also maximizes the restrictive region's pressure differential, which in turn maximizes the amount or volume of air flow that passes up through-opening 56, as well as maximizes the overall heat dissipation of the heat sink.

Figure 3:
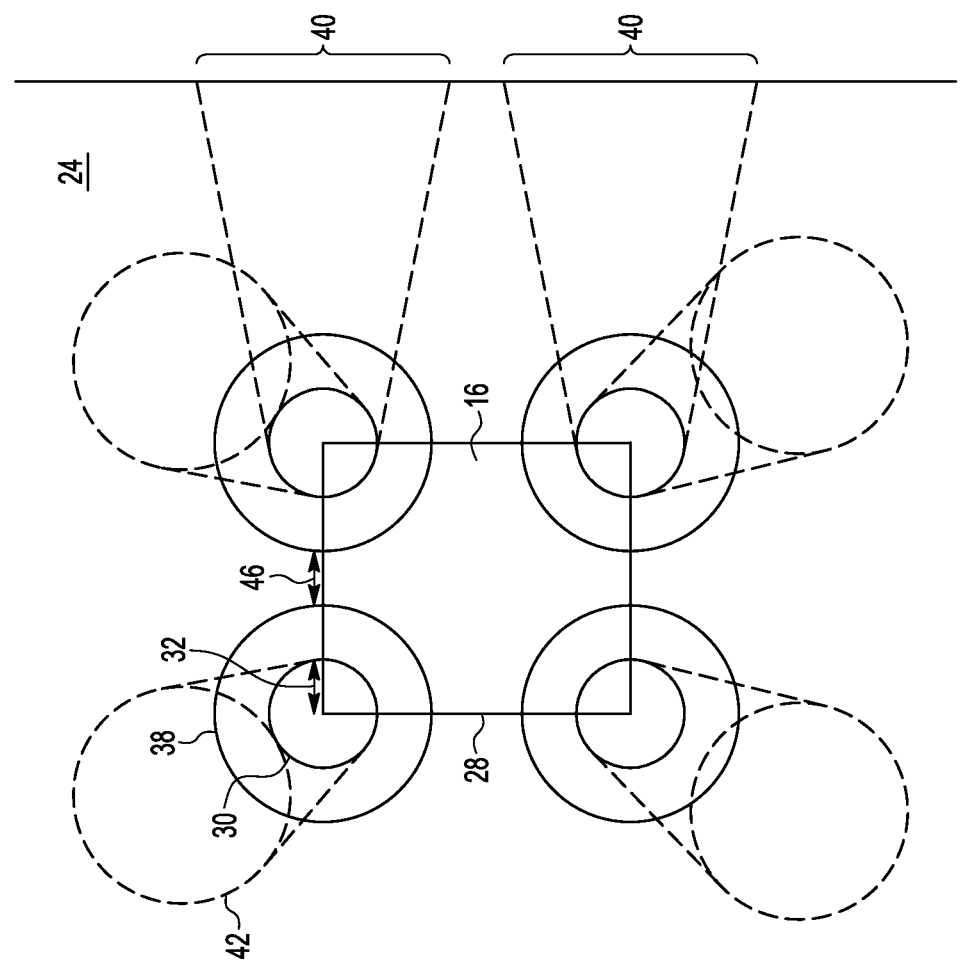
FIG. 3 illustrates a top-down view of an example heat sink in which the present disclosure is implemented, according to some embodiments.

FIG. 3 illustrates a top-down view of an example heat sink in which the present disclosure is implemented. As illustrated, heat sink 24 includes four through-openings, each having an outflow region, a restrictive region, and one or more inflow regions. Outflow openings 38 and top restrictive openings 30 of the through-openings are outlined in a solid line. It is noted that placement of at least a portion of restrictive region over die perimeter 28 also places at least a portion of outflow opening over die perimeter 28. Semiconductor die 16 is placed within die perimeter 28 and acts as a source of heat that is dissipated by heat sink 24. Outflow openings are located on the top surface of the heat sink, while top restrictive openings are located interior to the heat sink. Outflow openings are separated by a distance dimension 46, where the least distance separating neighboring outflow openings is measured along die perimeter 28. Inflow regions and inflow openings 42 and 40 of the through-openings are outlined in dotted lines, indicating that the inflow regions and openings are located within the heat sink beyond the illustrated top-down view. Inflow openings 42 are located on the bottom surface of the heat sink and inflow openings 40 are located on the sidewall surface of the heat sink.

By now it should be appreciated that there has been provided a heat sink design that will improve heat dissipation in a purely convective airflow environment without fan-cooling assistance and without increasing heat sink size. The present disclosure provides one embodiment that includes a semiconductor structure that includes a heat sink having a first major surface and a second major surface opposite the first major surface; a first sidewall surface between the first and second major surfaces; and a through-opening extending from one of the first sidewall surface or the first major surface of the heat sink to the second surface of the heat sink. The through-opening has an inflow region, a restrictive region, and an outflow region. The restrictive region is located between the inflow region and the outflow region. The inflow region has an inflow surface opening at the one of the first sidewall or the first major surface, and the outflow region has an outflow surface opening at the second major surface. A cross-sectional area of the restrictive region is less than an area of the inflow surface opening and less than an area of the outflow surface opening.

One aspect of the above embodiment further provides that the heat sink further includes a semiconductor die perimeter corresponding to a perimeter which surrounds a semiconductor die after attachment to the semiconductor die. A further aspect provides that the restrictive region overlaps the semiconductor die perimeter. Another further aspect provides that the restrictive region is located within the semiconductor die perimeter. Another further aspect provides that the inflow region extends from the first major surface to the restrictive region, and the inflow surface opening is located outside the semiconductor die perimeter.

Another aspect of the above embodiment further provides that the cross-sectional area of the restrictive region is as measured substantially perpendicular from a sidewall of the restrictive region. Another aspect further provides that the sidewall surface is substantially perpendicular to the second major surface.

Another aspect of the above embodiment further provides that the heat sink further includes a second sidewall surface between the first and second major surfaces. The through-opening further includes a second inflow region extending from one of the second sidewall surface or the first major surface to the restrictive region of the through-opening. The second inflow region has a second inflow surface opening at one of the second sidewall surface or the first major surface. The cross-sectional area of the restrictive region is less than an area of the second inflow surface opening.

Another aspect of the above embodiment further provides that the heat sink further includes a second sidewall between the first and second major surfaces; and a second through-opening extending from one of the second sidewall surface or the first major surface of the heat sink to the second major surface of the heat sink. The second through-opening has an inflow region, a restrictive region, and an outflow region. The inflow region has an inflow surface opening at one of the second sidewall or the first major surface, and the outflow region has an outflow surface opening at the second major surface. A cross-sectional area of the restrictive region is less than an area of the inflow surface opening of the second through-opening and less than an area of the outflow surface opening of the second through-opening. A further aspect provides that the heat sink further includes a semiconductor die perimeter corresponding to a perimeter which surrounds a semiconductor die after attachment to the semiconductor die. Each of the through-opening and the second through-opening overlap the semiconductor die perimeter.

Another aspect of the above embodiment further provides that the inflow region extends from the sidewall surface to the restrictive region, and the restrictive region is located above the inflow surface opening with respect to the first major surface of the heat sink.

Another aspect of the above embodiment further provides that the semiconductor structure includes a semiconductor die. The first major surface of the heat sink is attached to the semiconductor die with a thermal interface material.

Another embodiment of the present disclosure includes a semiconductor structure that includes a heat sink having a first major surface and a second major surface opposite the first major surface; a first sidewall surface between the first and second major surfaces; and a through-opening extending from each of the first major surface and the first sidewall surface, through the heat sink, to the second major surface. The through-opening has a first inflow region, a second inflow region, a restrictive region, and an outflow region. The outflow region extends from the restrictive region to the second major surface and has an outflow surface opening at the second major surface. The first inflow region extends from the first sidewall surface to the restrictive region and has a first inflow surface opening at the first sidewall surface. The second inflow region extends from the first major surface to the restrictive region and has a second inflow surface opening. A cross-sectional area of the restrictive region is less than an area of the first inflow surface opening, less than an area of the second inflow surface opening, and less than an area of the outflow surface opening.

One aspect of the above embodiment further provides that the restrictive region is located above the second inflow surface opening with respect to the first major surface.

Another aspect of the above embodiment further provides the heat sink further includes a semiconductor die perimeter corresponding to a perimeter which surrounds a semiconductor die after attachment to the semiconductor die. A further aspect provides the restrictive region overlaps the semiconductor die perimeter. Another further aspect provides that the restrictive region is located within the semiconductor die perimeter. Another further aspect provides that each of the first inflow region and the second inflow region is located outside the semiconductor die perimeter.

Another aspect of the above embodiment further provides that the semiconductor structure further includes a semiconductor die. The first major surface of the heat sink is attached to the semiconductor die with a thermal interface material.

Another embodiment of the present disclosure includes a semiconductor structure that includes a heat sink having a first major surface and a second major surface opposite the first major surface; a first sidewall surface between the first and second major surfaces; and a through-opening extending from one of the first sidewall surface or the first major surface of the heat sink to the second major surface of the heat sink. The through-opening has an inflow region, a restrictive region, and an outflow region. The restrictive region located between the inflow region and the outflow region. The inflow region has an inflow surface opening at the one of the first sidewall or the first major surface, and the outflow region has an outflow surface opening at the second major surface. A cross-sectional area of the restrictive region is less than an area of the inflow surface opening and less than an area of the outflow surface opening. The semiconductor structure further includes a semiconductor die. The first major surface of the heat sink is attached to the semiconductor die with a thermal interface material. The restrictive region overlaps a perimeter of the semiconductor die.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under," and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, while the heat sink is illustrated in FIG. 1 as having through-openings that each include two inflow regions, each through-opening can include a larger number of inflow regions. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor structure, comprising:
    a heat sink having:
        a first major surface and a second major surface opposite the first major surface, wherein at least a portion of the first major surface includes a thermal contact area for a semiconductor die, the thermal contact area surrounded by a semiconductor die perimeter;
        a first sidewall surface between the first and second major surfaces; and
        a through-opening extending from the first major surface of the heat sink to the second major surface of the heat sink, wherein the through-opening has an inflow region, a restrictive region, and an outflow region, the restrictive region located between the inflow region and the outflow region, wherein the inflow region has an inflow surface opening at the first major surface, and the outflow region has an outflow surface opening at the second major surface, wherein a cross-sectional area of the restrictive region is less than an area of the inflow surface opening and less than an area of the outflow surface opening.

2. The semiconductor structure of claim 1, wherein the semiconductor die perimeter corresponds to a perimeter which surrounds the semiconductor die after attachment to the semiconductor die.

3. The semiconductor structure of claim 1, wherein the restrictive region overlaps the semiconductor die perimeter.

4. The semiconductor structure of claim 1, wherein the restrictive region is located within the semiconductor die perimeter.

5. The semiconductor structure of claim 1, wherein the inflow region extends from the first major surface to the restrictive region, and the inflow surface opening is located outside the semiconductor die perimeter.

6. The semiconductor structure of claim 1, wherein the cross-sectional area of the restrictive region is as measured substantially perpendicular from a sidewall of the restrictive region.

7. The semiconductor structure of claim 1, wherein the sidewall surface is substantially perpendicular to the second major surface.

8. The semiconductor structure of claim 1, wherein the heat sink further includes a second sidewall surface between the first and second major surfaces, wherein the through-opening further includes a second inflow region extending from one of the second sidewall surface or the first sidewall surface to the restrictive region of the through-opening, wherein the second inflow region has a second inflow surface opening at the one of the second sidewall surface or the first sidewall surface, wherein the cross-sectional area of the restrictive region is less than an area of the second inflow surface opening.

9. The semiconductor structure of claim 1, wherein the heat sink further includes:
   a second sidewall between the first and second major surfaces; and
   a second through-opening extending from one of the second sidewall surface or the first major surface of the heat sink to the second major surface of the heat sink, wherein the second through-opening has an inflow region, a restrictive region, and an outflow region, wherein the inflow region has an inflow surface opening at the one of the second sidewall or the first major surface, and the outflow region has an outflow surface opening at the second major surface, wherein a cross-sectional area of the restrictive region is less than an area of the inflow surface opening of the second through-opening and less than an area of the outflow surface opening of the second through-opening.

10. The semiconductor structure of claim 9, wherein each of the through-opening and the second through-opening overlap the semiconductor die perimeter.

11. The semiconductor structure of claim 1, wherein the inflow region extends from the first major surface to the restrictive region, and the restrictive region is located above the inflow surface opening with respect to the first major surface of the heat sink.

12. The semiconductor structure of claim 1, further comprising:
   the semiconductor die, wherein the first major surface of the heat sink is attached to the semiconductor die within the thermal contact area with a thermal interface material.

13. A semiconductor structure, comprising:
   a heat sink having:
      a first major surface and a second major surface opposite the first major surface, wherein at least a portion of the first major surface includes a thermal contact area for a semiconductor die, the thermal contact area surrounded by a semiconductor die perimeter;
      a first sidewall surface between the first and second major surfaces; and
      a through-opening extending from each of the first major surface and the first sidewall surface, through the heat sink, to the second major surface, and having a first inflow region, a second inflow region, a restrictive region, and an outflow region, wherein the outflow region extends from the restrictive region to the second major surface and has an outflow surface opening at the second major surface, the first inflow region extends from the first sidewall surface to the restrictive region and has a first inflow surface opening at the first sidewall surface, and the second inflow region extends from the first major surface to the restrictive region and has a second inflow surface opening at the first major surface, wherein a cross-sectional area of the restrictive region is less than an area of the first inflow surface opening, less than an area of the second inflow surface opening, and less than an area of the outflow surface opening.

14. The semiconductor structure of claim 13, wherein the restrictive region is located above the second inflow surface opening with respect to the first major surface.

15. The semiconductor structure of claim 13, wherein
   the semiconductor die perimeter corresponds to a perimeter which surrounds the semiconductor die after attachment to the semiconductor die.

16. The semiconductor structure of claim 13, wherein the restrictive region overlaps the semiconductor die perimeter.

17. The semiconductor structure of claim 13, wherein the restrictive region is located within the semiconductor die perimeter.

18. The semiconductor structure of claim 13, wherein each of the first inflow region and the second inflow region is located outside the semiconductor die perimeter.

19. The semiconductor structure of claim 13, further comprising:
   the semiconductor die, wherein the first major surface of the heat sink is attached to the semiconductor die within the thermal contact area with a thermal interface material.

20. A semiconductor structure, comprising:
   a heat sink having:
      a first major surface and a second major surface opposite the first major surface;
      a first sidewall surface between the first and second major surfaces; and
      a through-opening extending from the first major surface of the heat sink to the second major surface of the heat sink, wherein the through-opening has an inflow region, a restrictive region, and an outflow region, the restrictive region located between the inflow region and the outflow region, wherein the inflow region has an inflow surface opening at the first major surface, and the outflow region has an outflow surface opening at the second major surface, wherein a cross-sectional area of the restrictive region is less than an area of the inflow surface opening and less than an area of the outflow surface opening; and
   a semiconductor die, wherein the first major surface of the heat sink is attached to the semiconductor die with a thermal interface material, and wherein the restrictive region overlaps a perimeter of the semiconductor die.

* * * * *